US008054619B1

(12) United States Patent
Antosh (10) Patent No.: US 8,054,619 B1
(45) Date of Patent: Nov. 8, 2011

(54) PARTIAL-SLOT CARD GUIDE INSTALLATION TOOL (75) Inventor: Kevin M. Antosh, Townsend, MA (US)

(73) Assignee: Juniper Networks, Inc., Sunnyvale, CA (US)

( * ) Notice: Subject to any disclaimer, the term of this patent is extended or adjusted under 35 U.S.C. 154(b) by 147 days.

(21) Appl. No.: 12/504,574

(22) Filed: Jul. 16, 2009

Related U.S. Application Data (60) Provisional application No. 61/180,317, filed on May 21, 2009.

(51) Int. Cl.
G06F 1/16 (2006.01)
(52) U.S. Cl. ............... 361/679.31; 710/306; 385/88; 455/557

(58) Field of Classification Search ............... 710/302, 710/307, 306, 104, 300, 15, 310, 316; 361/679.33, 361/679.49, 679.58, 679.32, 679.17, 679.57, 361/679.37, 679.21, 679.23, 679.48; 385/88; 455/550.1, 420, 557, 344
See application file for complete search history.

(56) References Cited

U.S. PATENT DOCUMENTS

| 5,761,033 | A | 6/1998 | Wilhelm |
| 6,824,312 | B2 | 11/2004 | McClellan et al. |
| 7,224,581 | B2 | 5/2007 | Garnett et al. |
| 7,414,852 | B1* | 8/2008 | Otte ........................ 361/726 |
| 2002/0006026 | A1 | 1/2002 | Takahashi et al. |
| 2002/0131257 | A1 | 9/2002 | Agard |
| 2004/0225802 | A1* | 11/2004 | Krishnamurthy et al. .... 710/302 |
| 2008/0123274 | A1* | 5/2008 | Desrosiers et al. .......... 361/683 |

* cited by examiner

Primary Examiner — Hung Duong
(74) Attorney, Agent, or Firm — Shumaker & Sieffert, P.A.

(57) ABSTRACT

A partial-slot card guide installation tool comprises two opposing runners configured to register with grooves of a full-sized slot of a rack system, and two guides fixed relative to the two opposing runners. The two guides configured to receive a partial-slot card guide and position the partial-slot card guide within the full-sized slot to provide a partial-sized slot smaller than the full-sized slot within the full-sized slot.

20 Claims, 9 Drawing Sheets

PARTIAL-SLOT CARD GUIDE INSTALLATION TOOL

This application claims the benefit of U.S. Provisional Application No. 61/180,317, filed May 21, 2009, the entire content of which is incorporated herein by reference.

TECHNICAL FIELD

This disclosure relates to rack system mounting systems for electronic components.

BACKGROUND

Electronic devices may be used in many types of systems and/or applications, such as control systems, data processing systems, medical systems, telecommunication systems and/or communication networks. Electronic devices may include system controllers, servers and/or data acquisition systems, medical imaging systems, central office systems, and/or network devices, such as routers, switches, firewalls, and/or network address translators. For some applications it may be desirable to make electronic devices scalable. For example, a communication network may be expanded to accommodate new users, modified to accommodate new networking protocols and/or types of data traffic, and/or may be reconfigured in response to network attacks and/or natural disasters.

Scalable electronic devices may include a rack system designed to accommodate certain changes. For instance, an electronic device may be configured to include a chassis that accepts removable cards to provide flexibility for accommodating new application requirements. Examples of cards may take the form of removable cards or boards that are configured and adapted for use in an electronic device. In some examples, a card is capable of receiving data from another device and/or capable of making data available to another device.

Rack system systems for electronic components, such as network routers generally include a plurality of slots for individual cards. In some systems, cards that occupy only half of a full-size slot may also be used, such that two "half-size" cards may fit within a full slot. In order to facilitate mounting two half-size cards in a full-size slot, a half-slot card guide is first mounted at the center of the full-size slot to divide the full-size slot into two half-size slots.

SUMMARY

Installation and/or removal of a half-slot card guide can damage sensitive electronic components in a rack system system. In particular, if the electronic components in a rack system are powered-on during installation and/or removal of a half-slot card guide, installation and/or removal can short out electronic components or cause other damage to the electronic components. In electronic systems where leaving electronic components powered-on is important to maintain constant system functionality, such as network routers, leaving electronic components powered-on is necessary even if a half-slot card guide needs to be installed or removed.

This disclosure includes techniques for installing a half-slot card guide into a rack system or other electronic device configured to receive removable cards. The disclosed techniques include a half-slot card guide installation tool that fits within guides of a rack system for a full-size card. Once installed in the slot for a full-sized slot card, the installation tools provide guides that physically register with slots of a half-slot card guide to be installed within the rack system. That is, when installed within a full-sized slot, the installation tool provides physical guides for receiving and precisely positioning a half-slot card guide within the same slot of the rack system system. Once the half-slot card guide is fastened within the slot of a rack system system, the half-slot card guide installation tool may be removed from the slot. The newly installed half-slot card guide is physically registered with upper and lower guides of the full-height slot of the rack system so as to provide two half-slots for insertion of up to two half-height cards.

In one example, a partial-slot (e.g., half-height) card guide installation tool comprises two opposing runners configured to register with grooves of a full-sized slot of a rack system; and two guides fixed relative to the two opposing runners. The two guides configured to receive a partial-slot card guide and position the partial-slot card guide within the full-sized slot to provide a partial-sized slot smaller than the full-sized slot within the full-sized slot.

In another example, an assembly comprises a rack system including a full-sized slot; a partial-slot card guide installation tool seated within the slot; and a partial-slot card guide seated within the partial-slot card guide installation tool. The partial-slot card guide installation tool comprises two opposing runners that fit within grooves of the full-sized slot; and two guides fixed relative to the two opposing runners. The two guides receive the partial-slot card guide and position the partial-slot card guide within the full-sized slot to provide a partial-sized slot smaller than the full-sized slot within the full-sized slot. A further example is directed to a method for installing a partial-slot card guide in a full-sized slot of a rack system system. The method comprises inserting a partial-slot card guide installation tool within the full-sized slot. The partial-slot card guide installation tool comprises two opposing runners configured to register with the grooves of the full-sized slot, wherein the opposing runners register with the grooves of the full-sized slot when the partial-slot card guide installation tool is inserted within the full-sized slot; and two guides fixed relative to the two opposing runners, wherein the two guides are configured to receive the partial-slot card guide. The method further comprises inserting the partial-slot card guide within the partial-slot card guide installation tool to position the partial-slot card guide within the full-sized slot; securing the partial-slot card guide within the full-sized slot to provide a partial-sized slot smaller than the full-sized slot; and removing the partial-slot card guide installation tool from the full-sized slot.

The disclosed techniques may provide one or more advantages. For example, the disclosed techniques may facilitate installation of a half-slot guide into a rack system with powered-on electronic components without a significant risk of damaging electronic components within the rack system by an electrical short or otherwise. That is, by use of the installation tool described herein, a half-slot guide may be more readily positioned within an open slot of an electronic component without requiring the device be powered down.

Furthermore, the techniques disclosed herein may allow a manufacture to reduce the number of half-slot card guides included for sale with a rack system system. Without a half-slot card guide installation tool, previous rack system systems may have been sold with half-slot card guides pre-installed in every slot in an attempt to reduce the chance that a customer would damage electronic components within rack system while attempting to install a half-slot card guide. Because the techniques disclosed herein allow for simple installation of half-slot card guides within a rack system with powered-on electronic components, it is not necessary to populate all the slots of the rack system with half-slot card guides. Instead, a rack system may be sent to a customer with a suitable number of half-slot card guides and a single half-slot card guide installation tool. For this reason, the techniques disclosed herein may save costs associated with including half-slot card guides for every slot in a rack system system.

DETAILED DESCRIPTION

Figure 1:
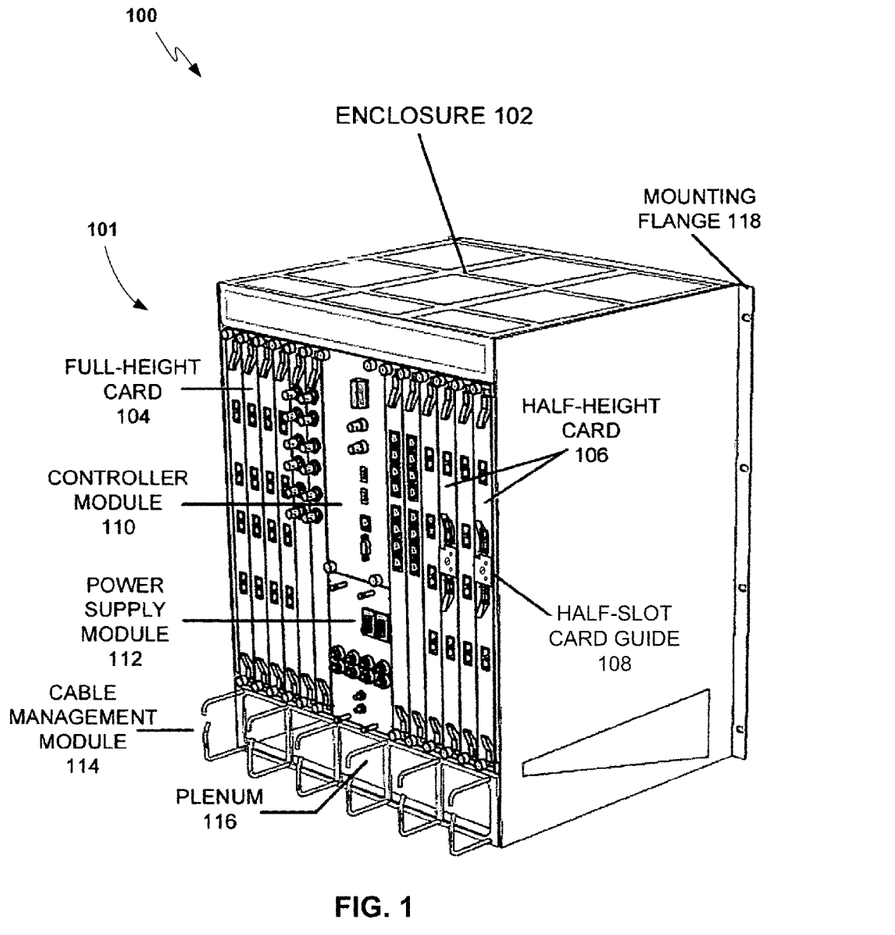
FIG. 1 illustrates an electronic device including a rack system capable of accepting half-slot card guides using a half-slot card guide installation tool.

FIG. 1 illustrates electronic device 100, which includes rack system 101. Rack system 101 provides a plurality of slots capable of removable electronic cards. In some cases the electronic cards may be a full-height card (such as full-height card 104) that occupies an entire slot. Moreover, electronic device 100 is capable of accepting half-slot card guides using a half-slot card guide installation tool in accordance with the techniques disclosed herein. In the example illustrated in FIG. 1, electronic device 100 includes enclosure 102, a full-height card 104, a half-height card 106, a half-slot card guide 108, controller module 110, power supply module 112, cable management module 114, plenum 116 and mounting flange 118. In other examples, an electronic device including a half-slot card guide 108 may be configured differently and/or include a different set of components.

Enclosure 102 may be fabricated from combinations of metal, plastic and/or composite and may be sized for any particular application. In one example, enclosure 102 may be sized to fit an industry-standard mounting structure, such as an equipment rack. Enclosure 102 includes mounting flange 118 to facilitate attachment of enclosure 102 to a mounting structure, such as an equipment rack. Mounting flange 118 includes one or more mounting holes for accepting fasteners, such as machine screws, for use in attaching electronic device 100 to a mounting structure.

Full-height card 104 and half-height card 106 may include any device(s) and/or component(s) that are configured to operate when installed within slots of rack system 101. As used herein when referring to cards, the term "height" denotes a length associated an edge of a card in a direction parallel with the slot in which the card is installed, regardless of whether in a vertical orientation, a horizontal orientation, and/or another orientation. Full-height card 104 and/or half-height card 106 may be removably coupled to electronic device 100 using fasteners, catches, and/or other retaining mechanisms. The cards are configured to have a predetermined height and/or depth so as to be retained by a chassis and/or half-slot card guide 108 inside electronic device 100. In one example, full-height card 104 may have dimensions about 15 inches high by approximately 8 inches deep, whereas half-height card 106 may have dimensions about 7 inches high by approximately 8 inches deep.

Full-height card 104, half-height card 106 and/or other types of partial-height cards are configured to perform certain functions using a combination of hardware and/or software components. In one example, full-height card 104, half-height card 106 and/or other types of partial-height cards are configured to perform packet forwarding, network address translation, data encryption, data processing, and/or data storage using hardware and/or software components.

Figure 2A:
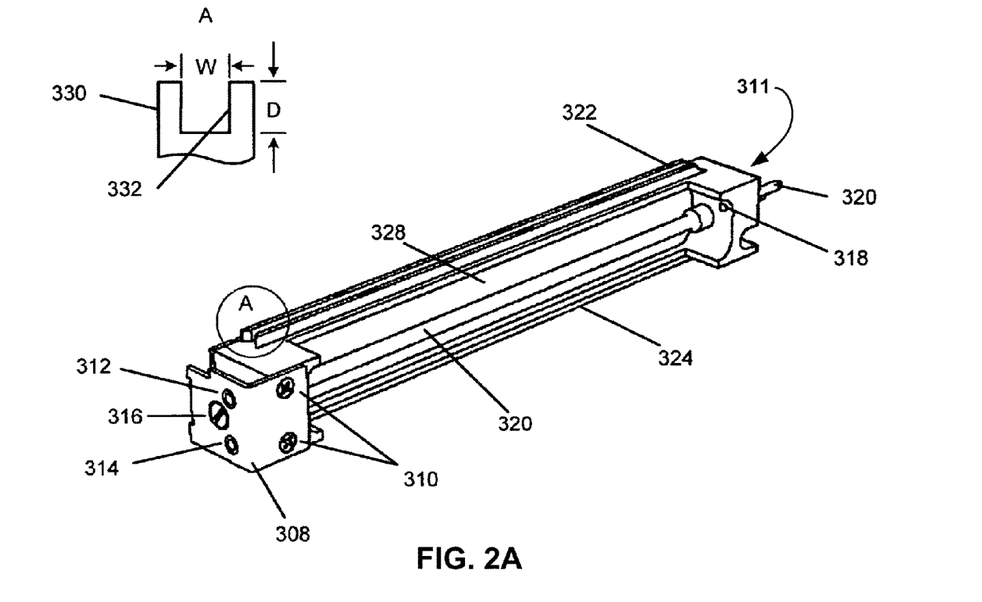
FIGS. 2A and 2B illustrate an exemplary half-slot card guide that may be installed in a slot of a rack system using the half-slot card guide installation tool of FIGS. 1A-1D.

Half-slot card guide 108 is configured to couple two or more partial-height cards into an assembly that can be configured and adapted to fit into a chassis slot within enclosure 102. As an example, half-slot card guide 108 may be an elongated apparatus (as shown by way of example in FIG. 2) having a height about one inch, a width about 1 inch, and a depth about 8 inches. In this example, the combined height of half-slot card guide 108 and two half-height cards 106 is equal to the height of a single full-height card 104. When mounted within an open slot, half-slot card guide 108 provides guide means and structural support necessary for two half-height cards 106 to be installed and received by electronic device 100.

Controller module 110 is configured to control and/or monitor the operation of one or more cards operating in electronic device 100. In this example, controller module 110 includes a special-purpose computer mounted on a full-height card 104 so as to occupy a full-height slot in a chassis within electronic device 100. In another example, controller module 110 may have a different dimension, such as for mounting in a partial-height card slot or in a dedicated portion of electronic device 100.

Power supply module 112 provides power to devices operating in electronic device 100. Power supply module 112 is configured to perform voltage and/or current conversion and includes one or more inputs and/or outputs. In one example, power supply module 112 may accept an alternating current (AC) from a wall receptacle and provide a direct current (DC) to devices operating within electronic device 100.

Cable management module 114 is configured to retain and/or manage cables. In one example, cable management module 114 includes guides and/or channels for retaining wires and/or optical fibers associated with fill-height card 104, half-height card 106, controller module 110 and/or power supply module 112.

Plenum 116 facilitates and/or directs airflow through electronic device 100. In one example, plenum 116 includes one or more openings, or channels, for accepting an input air volume and directing the input air volume across interior portions of full-height card 104, half-height card 106, controller module 110 power supply module 112, and/or other devices, components and/or cards.

Figure 2B:
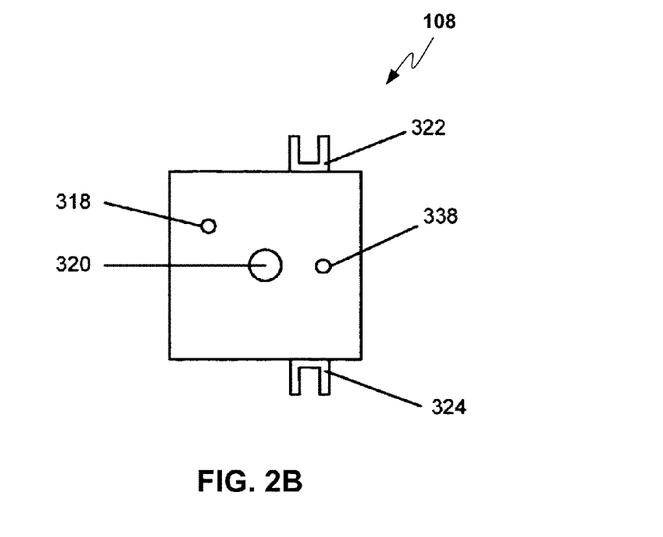
Figure 3A:
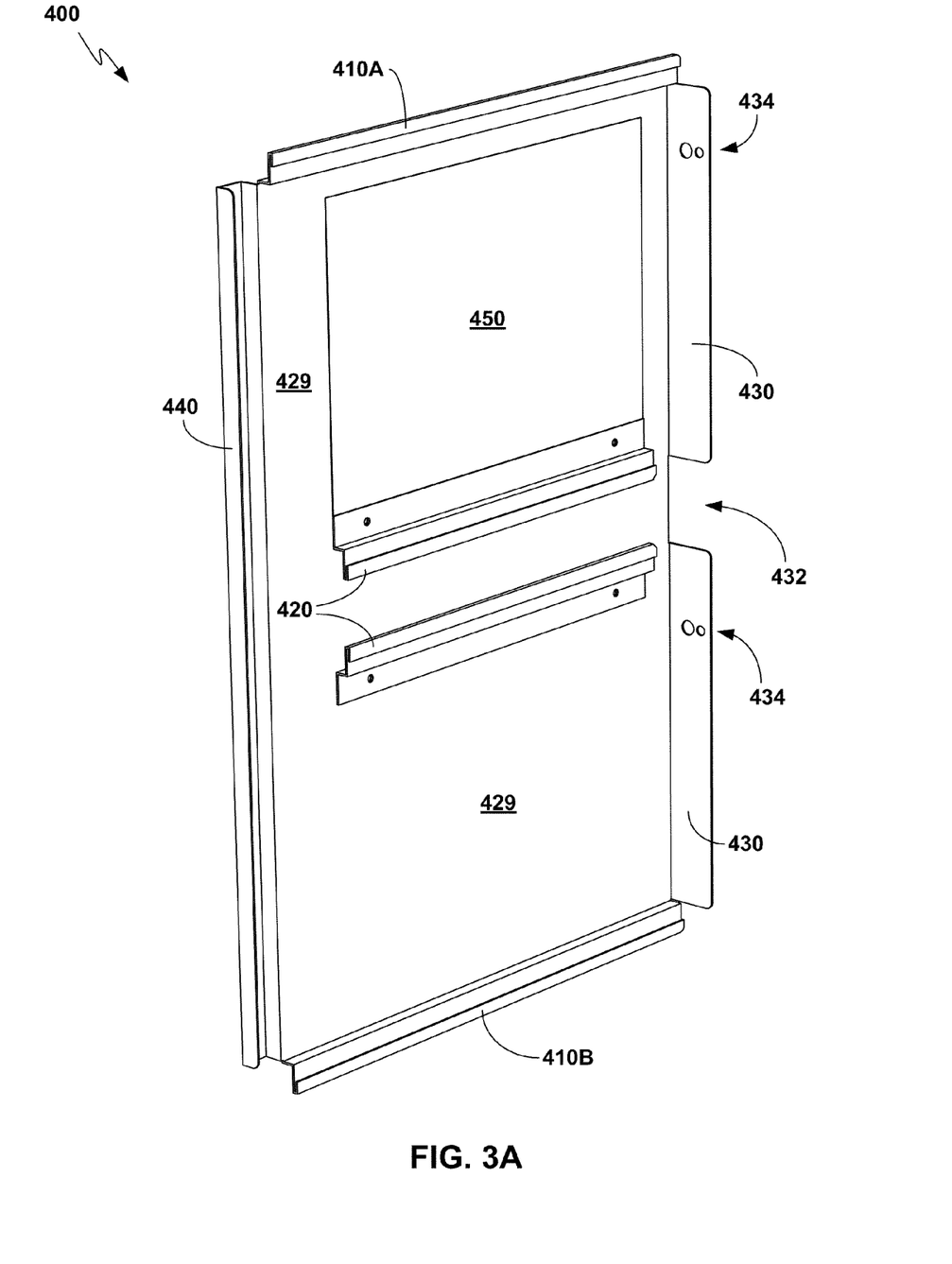
FIGS. 3A-3D illustrate a half-slot card guide installation tool.
Figures 3B, 3C:
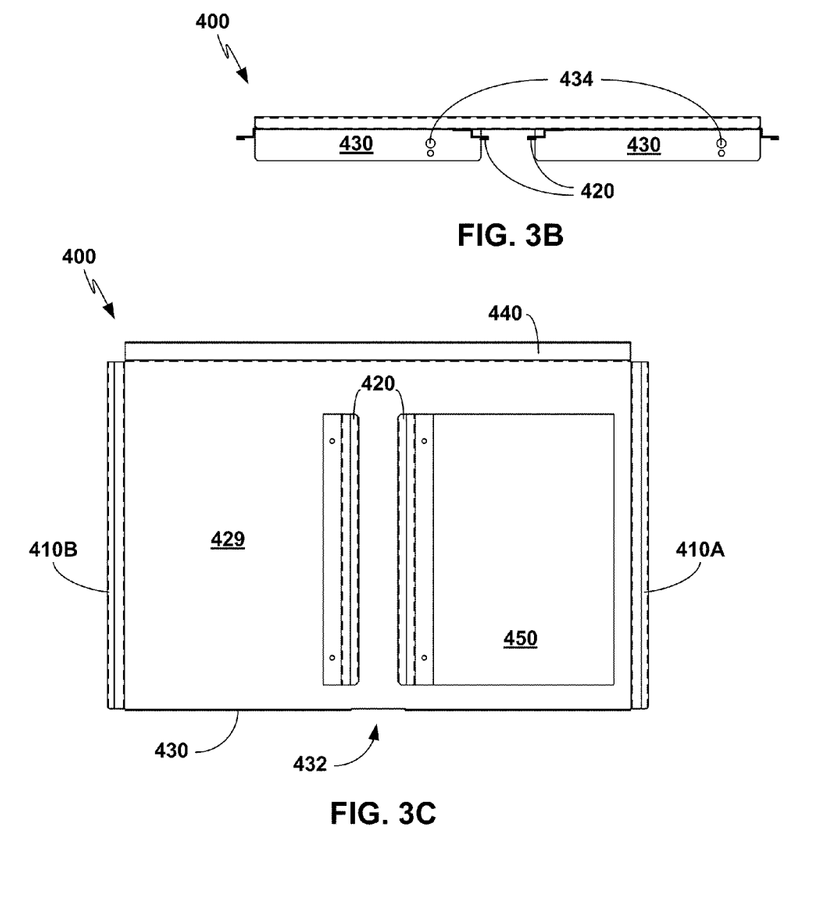
Figure 3D:
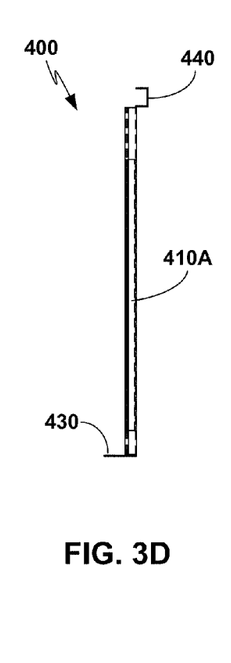

FIGS. 2A and 2B illustrate perspective views of half-slot card guide 108. Half-slot card guide 108 includes angled face plate 308, pair of face plate screws 310, upper receptacle 312, lower receptacle 314, upper alignment post 318, lower alignment post 338, threaded shaft 320, upper guide 322, lower guide 324 and connecting member 328.

Angled face plate 308 is configured to retain upper receptacle 312, lower receptacle 314, and shaft head 316. Angled face plate 308 is configured to receive a lower locking/retaining mechanism associated with an upper card and/or an upper locking/retaining mechanism associated with a lower card. Angled face plate 308 may be attached to half-slot card guide 108 using face plate screws 310, other fastening devices and/or fastening techniques, such as rivets, adhesive, and/or welds.

Upper receptacle 312 and/or lower receptacle 314 are configured to receive a threaded portion of a retaining mechanism, such as a thumb screw. In one example, upper receptacle 312 and/or lower receptacle 314 may be identical and includes threaded inserts.

Shaft head 316 is suitable to operatively engage a tightening device such as a screwdriver and/or a wrench. Shaft head 316 located on a proximal end of threaded shaft 320. When shaft head 316 is rotated in a direction using a tightening device, threaded shaft 320 rotates in the same direction to engage and/or disengage half-slot card guide 108 from within a slot.

Upper guide 322 is configured to retain a portion of a card, such as an edge of a printed circuit board (PCB) or other card, in a determined position with respect to half-slot card guide 108. As shown in close-up view "A," upper guide 322 includes first wall 330 and opposing second wall 332. First wall 330 and second wall 332 are configured to retain a card edge therebetween. First wall 330 and second wall 332 each have a depth (D) and are separated by a width (W). In one example, the width W may be about 0.10 inches and depth D may be about 0.15 inches. Other examples may use different widths and/or depths.

Upper guide 322 and lower guide 324 may be arranged substantially along a longitudinal axis passing through the center of half-slot card guide 108. Alternatively, upper guide 322 and/or lower guide 324 may be offset from the longitudinal axis (as shown in FIG. 2B).

Connecting member 328 is formed from a solid C-shaped piece of metal, such as machined aluminum, providing a solid mounting surface 311. Because of the durable construction of connecting member 328, threaded shaft 320 itself is sufficient to securely fasten half-slot card guide 108 within a full-size chassis slot, such as slot 120 (FIGS. 5A-5D). In other examples, connecting member 328 may be machined, extruded, cast and/or forged and may be made from metal, plastic and/or composites.

First upper alignment post 318 and/or lower alignment post 338 (FIG. 2B) is configured to engage alignment features of a chassis slot when half-slot card guide 108 is installed in the chassis slot. Upper alignment post 318 and/or lower alignment post 338 may operate to prevent half-slot card guide 108 from rotating about a longitudinal axis passing lengthwise through half-slot card guide 108 when installed within a full-size chassis slot. Upper alignment post 318 and/or lower alignment post 338 may operate alone and/or in conjunction with other alignment devices, mechanisms and/or structures to maintain half-slot card guide 108 in a determined position.

Installation and/or removal of half-slot card guide 108 can damage sensitive electronic components in a rack system system. In particular, if the electronic components in a rack system are powered-on installation and/or removal of a half-slot card guide can short out electronic components. In electronic systems where leaving electronic components powered-on is important to maintain constant system functionality, such as network routers, leaving electronic components powered-on is necessary even if half-slot card guide 108 needs to be installed or removed.

Figure 4:
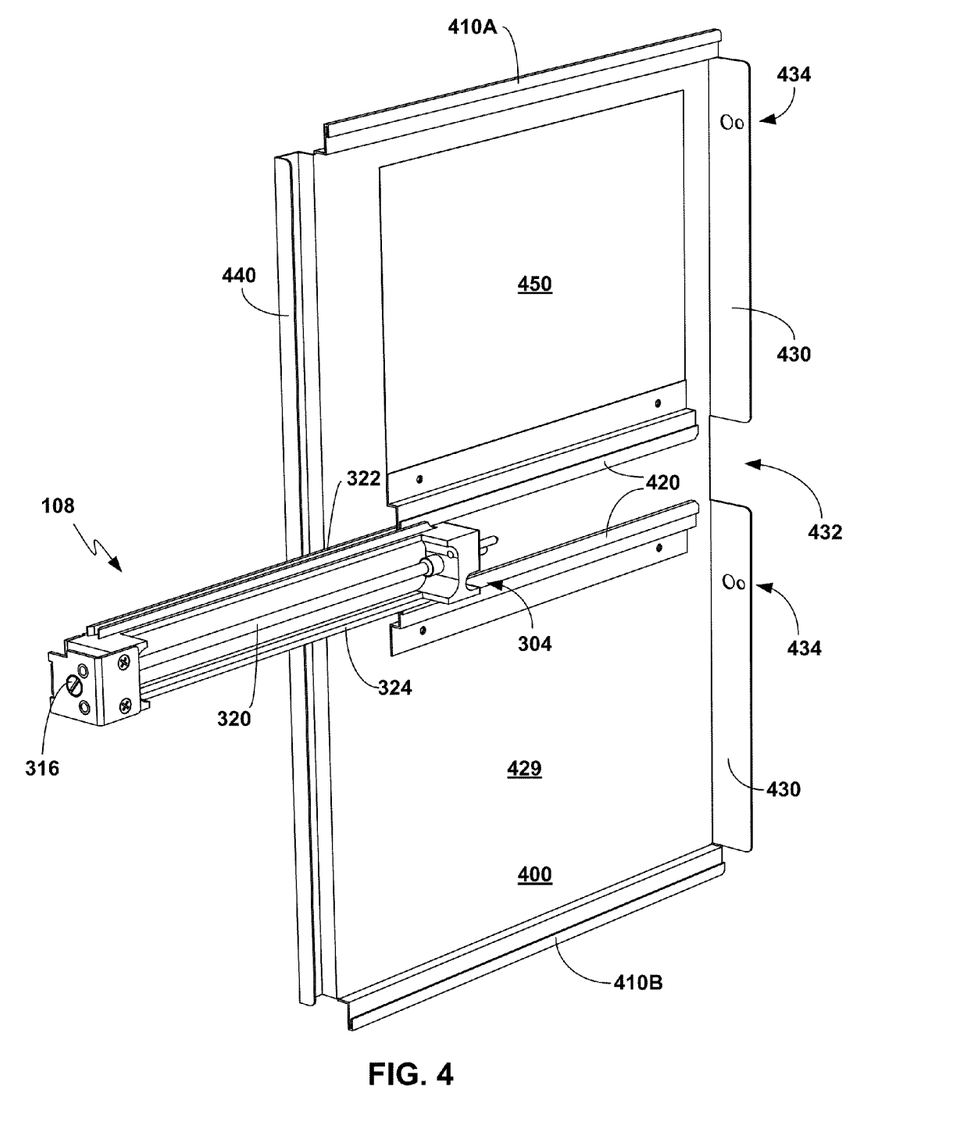
FIG. 4 illustrates a half-slot card guide mated with the half-slot card guide installation tool of FIGS. 3A-3D.

FIGS. 3A-3D illustrate half-slot card guide installation tool 400. FIG. 4 illustrates a half-slot card guide mated with the half-slot card guide installation tool of FIGS. 3A-3D. Half-slot card guide installation tool 400 facilitates simple installation and removal of half-slot card guide 108, and reduces the risk of damaging electronic components in an a rack system when installing or removing half-slot card guide 108.

Half-slot card guide installation tool 400 is sized to fit securely within a full-size card slot of a rack, such as slot 120 (FIGS. 5A-5D). Specifically, half-slot card guide installation tool 400 includes runners 410A, 410B, which register within the grooves of a slot, and are approximately the same thickness as the edge of a PCB or other card that mounts in the slot of the rack. For example, runners 410A, 410B may be formed using a sheet metal return flange. Runners 410A, 410B are spaced-apart the width of a full-size slot by connecting member 429. In an example, the height of half-slot card guide installation tool 400 including runners 410A, 410B may be about 15 inches.

Half-slot card guide installation tool 400 also includes handle 440, which allows for easy insertion and removal of half-slot card guide installation tool 400 in a slot. Half-slot card guide installation tool 400 also includes back 430, which includes backplane alignment features 434 to accurately position half-slot card guide installation tool 400 once it is inserted within a slot. Space 432 allows room for half-slot card guide 108 (FIGS. 2A-2B) to be mounted within the slot, such as such as slot 120 (FIGS. 5A-5D). Handle 440 and back 430 are fixed to connecting member 429.

While runners 410A, 410B and backplane alignment features 434 combine to facilitate precise positioning of half-slot card guide installation tool 400 within a slot, guides 420 facilitate precise positioning of half-slot card guide 108 relative to half-slot card guide installation tool 400. As best shown in FIG. 4, guides 420 are configured to receive half-slot card guide 108. Guides 420 locate half-slot card guide 108 within the center of the full-sized slot, such as slot 120 (FIGS. 5A-5D), to provide two half-sized slots in the full-sized slot. Specifically, upper groove 322 and lower groove 324 of half-slot card guide 108 register with guides 420 of half-slot card guide installation tool 400 to precisely position half-slot card guide 108 within a slot. Guides 420 may be substantially coplanar to runners 410A, 410B, and are also fixed to connecting member 429. In addition, guides 420 may be substantially parallel to runners 410A, 410B.

Half-slot card guide installation tool 400 may be formed using sheet metal. For example, runners 410A, 410B, back 430 and handle 440 may be formed from a single piece of sheet metal. In addition, guides 420 may be formed from additional pieces of sheet metal and attached to runners 410A, 410B, back 430 and handle 440 using rivets or by other suitable techniques. Runners 410A, 410B and guides 420 may be formed using a return flange to provide a thickness suitable for mounting half-slot card guide installation tool 400 in slot 360, such as a thickness about the same as the thickness of a PCB of an electronic component configured to be mounted within slot 360.

Half-slot card guide installation tool 400 may also include instruction label 450 on connecting member 429. Instruction label 450 provides instructions for installation and removal of a half-slot card guide using half-slot card guide installation tool 400. For example, instruction label 450 may includes each of the steps illustrated in FIGS. 5A-5D.

Figure 5A:
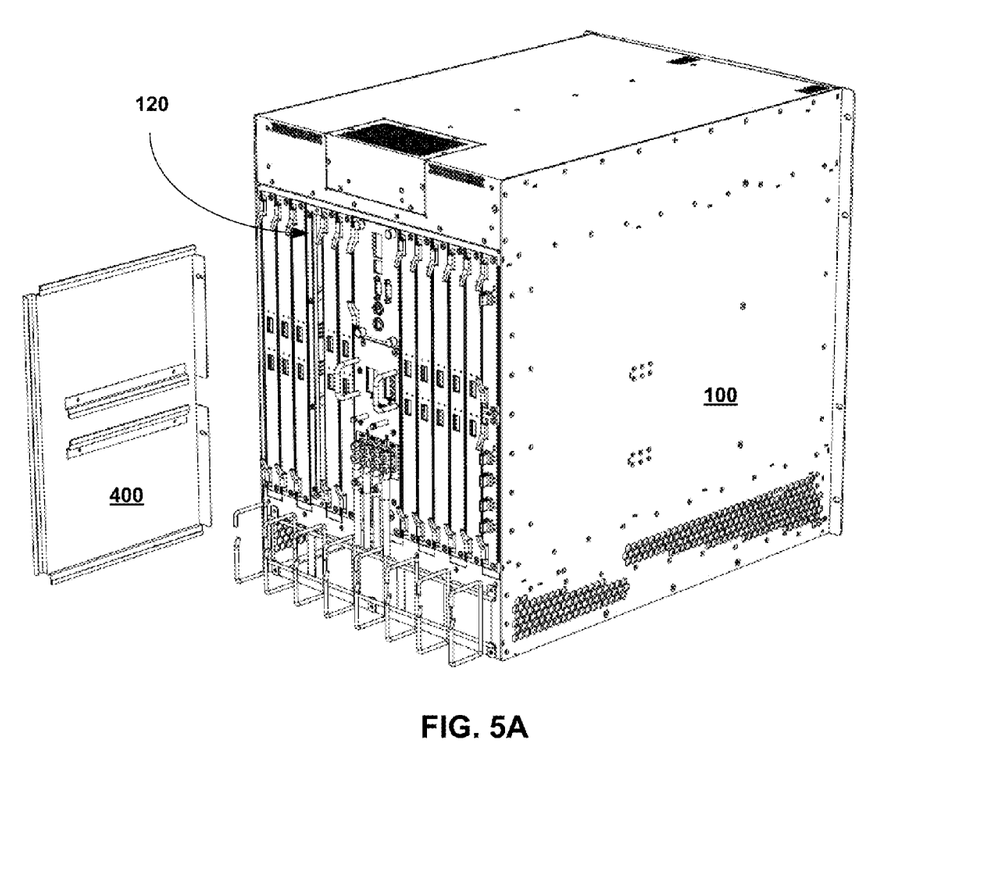
FIGS. 5A-5D illustrate steps for mounting a half-slot card guide in a slot of a rack system using a half-slot card guide installation tool.

FIGS. 5A-5D illustrate steps for mounting half-slot card guide 108 in slot 120 of electronic device 100 using half-slot card guide installation tool 400. As shown in FIG. 5A, the first step is to insert half-slot card guide installation tool 400 into empty full-size slot 120. When inserting half-slot card guide installation tool 400 into empty full-size slot 120, runners 410A, 410B register with the guides of slot 120 and backplane alignment features 434 register with alignment features within the backplane of the slot.

Figure 5B:
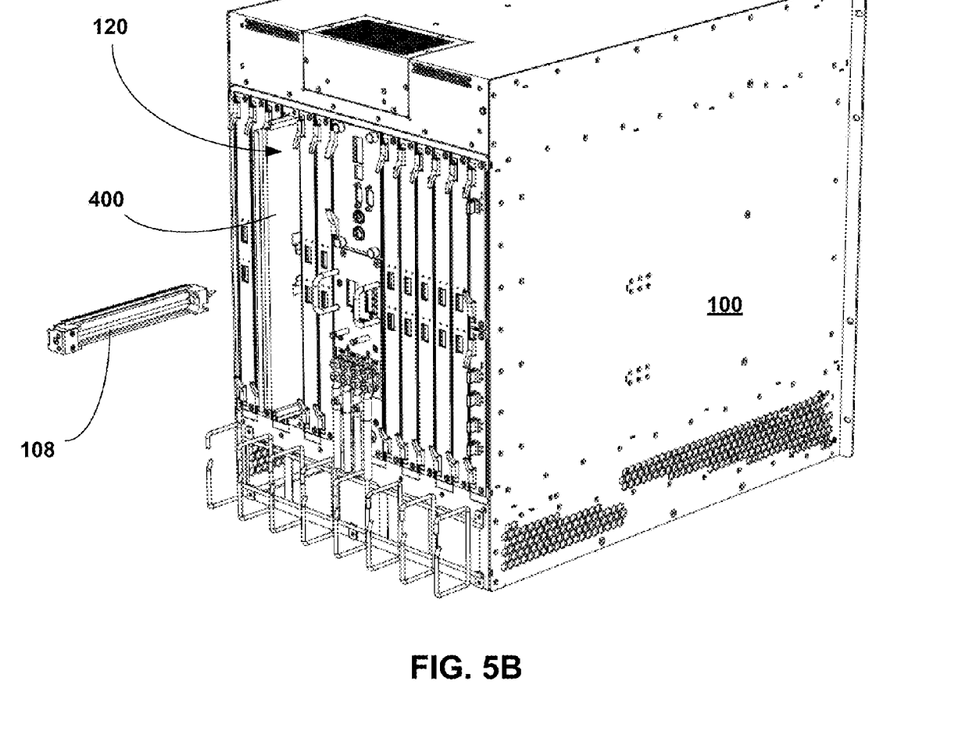

As shown in FIG. 5B, once half-slot card guide installation tool 400 is fully-inserted into slot 120, the second step is to insert half-slot card guide 108 into slot 120 using half-slot card guide installation tool 400 to located half-slot card guide 108 within the proper position within slot 120. Specifically, upper groove 322 and lower groove 324 of half-slot card guide 108 register with guides 420 of half-slot card guide installation tool 400 to precisely position half-slot card guide 108 within slot 120.

Figure 5C:
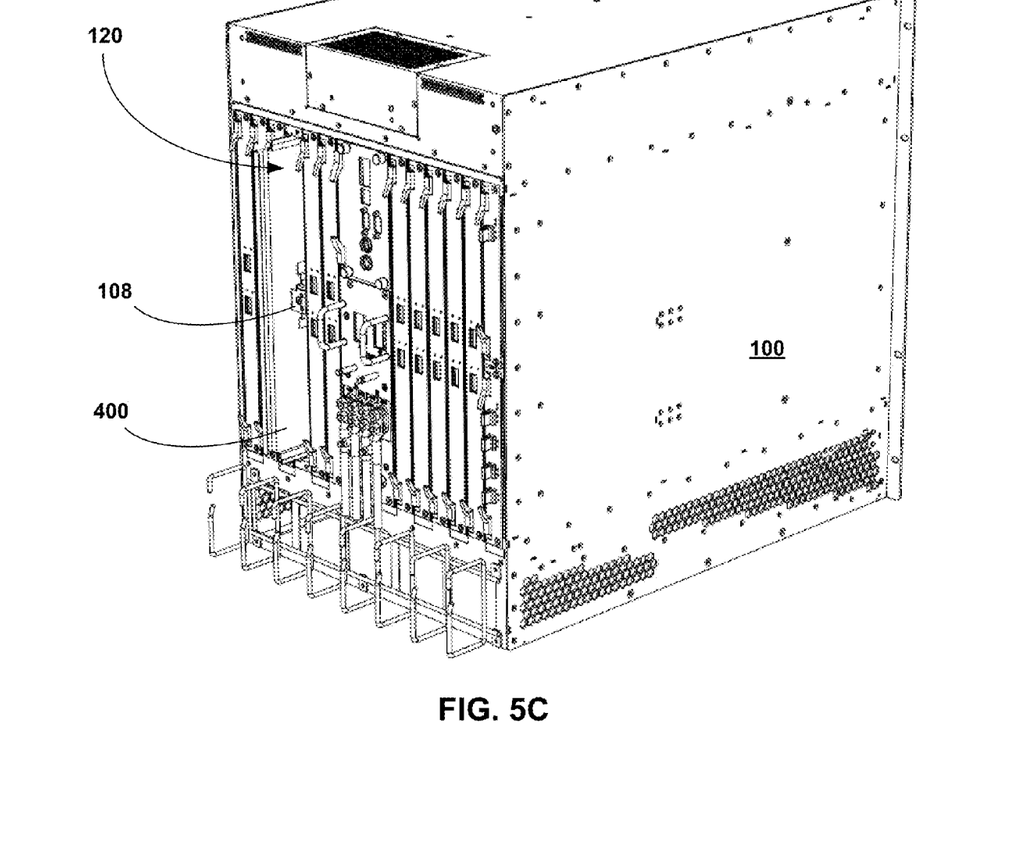

As shown in FIG. 5C, once half-slot card guide 108 is in the proper location within slot 120 as provided by the position of half-slot card guide installation tool 400 and guides 420, half-slot card guide 108 is secured to electronic device 100 within slot 120 by rotating shaft head 316 to engage threaded shaft 320 with a corresponding treaded hole within slot 120. Because of the durable construction of half-slot card guide 108, threaded shaft 320 itself is sufficient to securely fasten half-slot card guide 108 within slot 120.

Figure 5D:
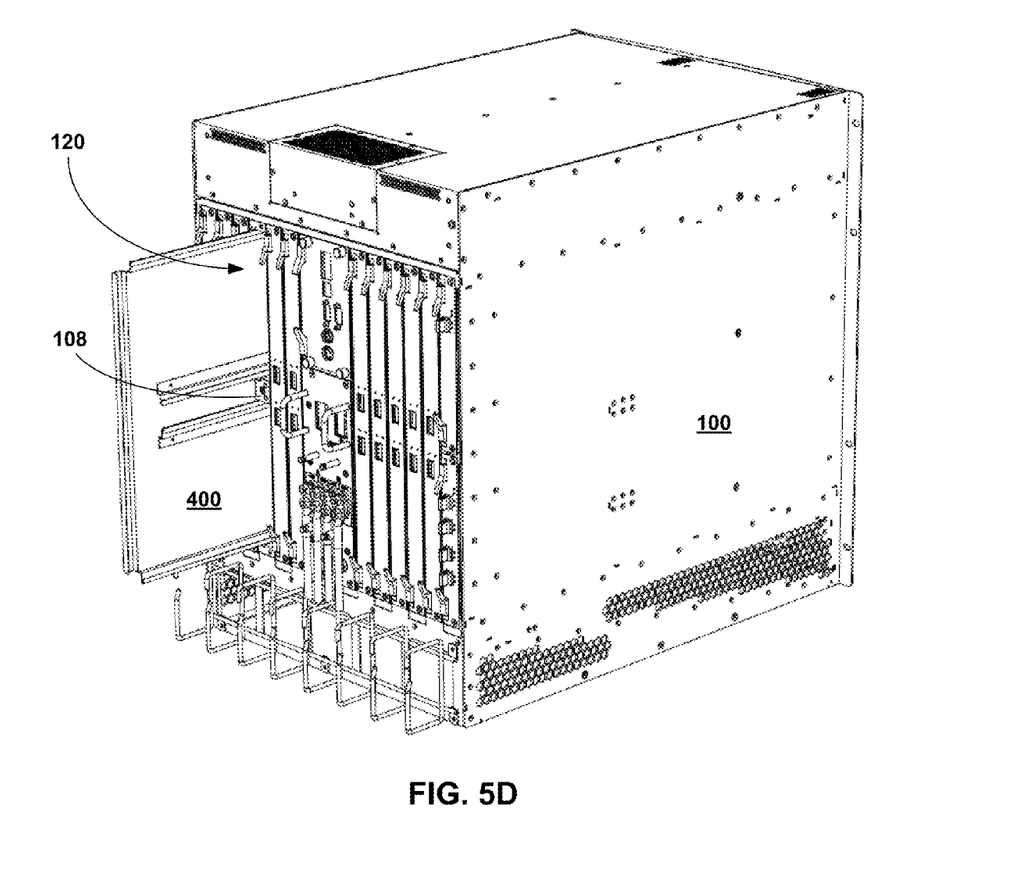

As shown in FIG. 5D, once half-slot card guide 108 is secured to electronic device 100 within slot 120 by threaded shaft 320, half-slot card guide installation tool 400 is removed from slot 120 by pulling on handle 440. The combination of slot 120 and half-slot card guide 108 now provides two half-size card slots where one Various examples have been described. However, various modifications can be made to the described examples within the spirit of the invention. For example, examples described with reference to a half-slot are equally applicable to any size partial-sized slot. These and other examples are within the scope of the following claims.

The invention claimed is:

1. A partial-slot card guide installation tool comprising:
two opposing runners configured to register with grooves of a full-sized slot of a rack system;
a connecting member extending between the two opposing runners, wherein the opposing runners are spaced apart a width of the full-sized slot in fixed positions relative to each other by the connecting member to facilitate seating the partial-slot card guide installation tool within the full-sized slot; and
two guides fixed relative to the two opposing runners, wherein the two guides configured to receive a partial-slot card guide and position the partial-slot card guide within the full-sized slot to provide a partial-sized slot smaller than the full-sized slot within the full-sized slot.

2. The partial-slot card guide installation tool of claim 1, wherein the two opposing runners and slots of the two guides are substantially coplanar.

3. The partial-slot card guide installation tool of claim 2, wherein the two opposing runners and slots of the two guides are substantially parallel.

4. The partial-slot card guide installation tool of claim 1, wherein the partial-slot card guide installation tool is made of sheet metal.

5. The partial-slot card guide installation tool of claim 4, wherein the two guides are made of sheet metal mated to a separate piece of sheet metal that forms the connecting member and the two opposing runners.

6. The partial-slot card guide installation tool of claim 1, wherein the partial-slot card guide is a half-slot card guide, and
wherein the two guides are configured to receive the half-slot card guide and position the half-slot card guide within the center of the full-sized slot to provide two half-sized slots.

7. A partial-slot card guide installation tool comprising:
two opposing runners configured to register with grooves of a full-sized slot of a rack system;
two guides fixed relative to the two opposing runners, wherein the two guides configured to receive a partial-slot card guide and position the partial-slot card guide within the full-sized slot to provide a partial-sized slot smaller than the full-sized slot within the full-sized slot; and
a back substantially perpendicular to the two guides, the back including alignment features configured to mate with alignment features on a backplane of the rack system.

8. The partial-slot card guide installation tool of claim 7, further comprising a handle opposite the back to facilitate easy insertion and removal of the partial-slot card guide installation tool from the full-sized slot.

9. An assembly comprising:
a rack system including a full-sized slot;
a partial-slot card guide installation tool seated within the slot; and
a partial-slot card guide seated within the partial-slot card guide installation tool,
wherein the partial-slot card guide installation tool comprises:
two opposing runners that fit within grooves of the full-sized slot;
a connecting member extending between the two opposing runners, wherein the opposing runners are spaced apart a width of the full-sized slot in fixed positions relative to each other by the connecting member to facilitate seating the partial-slot card guide installation tool within the full-sized slot; and
two guides fixed relative to the two opposing runners, wherein the two guides receive the partial-slot card guide and position the partial-slot card guide within the full-sized slot to provide a partial-sized slot smaller than the full-sized slot within the full-sized slot.

10. The assembly of claim 9, wherein the two opposing runners and slots of the two guides are substantially coplanar.

11. The assembly of claim 10, wherein the two opposing runners and slots of the two guides are substantially parallel.

12. The assembly of claim 9, wherein the partial-slot card guide installation tool is made of sheet metal.

13. The assembly of claim 12, wherein the two guides are made of sheet metal mated to a separate piece of sheet metal that forms the two opposing runners.

14. An assembly comprising:
a rack system including a full-sized slot;
a partial-slot card guide installation tool seated within the slot; and
a partial-slot card guide seated within the partial-slot card guide installation tool,
wherein the partial-slot card guide installation tool comprises:
two opposing runners that fit within grooves of the full-sized slot; and
two guides fixed relative to the two opposing runners, wherein the two guides receive the partial-slot card guide and position the partial-slot card guide within the full-sized slot to provide a partial-sized slot smaller than the full-sized slot within the full-sized slot,
wherein the partial-slot card guide installation tool further comprises a back substantially perpendicular to the two guides, the back including alignment features configured to mate with alignment features on a backplane of the rack system.

15. The assembly of claim 9,
wherein the partial-slot card guide is a half-slot card guide, and wherein the two guides are configured to receive the half-slot card guide and position the half-slot card guide within the center of the full-sized slot to provide two half-sized slots.

16. A method for installing a partial-slot card guide in a full-sized slot of a rack system comprising:
   inserting a partial-slot card guide installation tool within the full-sized slot, wherein the partial-slot card guide installation tool comprises:
      two opposing runners configured to register with the grooves of the full-sized slot, wherein the opposing runners register with the grooves of the full-sized slot when the partial-slot card guide installation tool is inserted within the full-sized slot;
      a connecting member extending between the two opposing runners, wherein the opposing runners are spaced apart a width of the full-sized slot in fixed positions relative to each other by the connecting member to facilitate seating the partial-slot card guide installation tool within the full-sized slot; and
      two guides fixed relative to the two opposing runners, wherein the two guides are configured to receive the partial-slot card guide;
   inserting the partial-slot card guide within the partial-slot card guide installation tool to position the partial-slot card guide within the full-sized slot;
   securing the partial-slot card guide within the full-sized slot to provide a partial-sized slot smaller than the full-sized slot; and
   removing the partial-slot card guide installation tool from the full-sized slot.

17. The method of claim 16, wherein securing the partial-slot card guide within the full-sized slot comprising rotating a threaded shaft of the partial-slot card guide to engage a threaded hole within the slot.

18. The method of claim 16,
   wherein the partial-slot card guide is a half-slot card guide, and
   wherein inserting the partial-slot card guide within the partial-slot card guide installation tool to position the partial-slot card guide within the full-sized slot positions the half-slot card guide within the center of the full-sized slot to provide two half-sized slots.

19. The method of claim 16 further comprising installing a partial-height card in the partial-sized slot.

20. A method for installing a partial-slot card guide in a full-sized slot of a rack system comprising:
   inserting a partial-slot card guide installation tool within the full-sized slot, wherein the partial-slot card guide installation tool comprises:
      two opposing runners configured to register with the grooves of the full-sized slot, wherein the opposing runners register with the grooves of the full-sized slot when the partial-slot card guide installation tool is inserted within the full-sized slot; and
      two guides fixed relative to the two opposing runners, wherein the two guides are configured to receive the partial-slot card guide;
   inserting the partial-slot card guide within the partial-slot card guide installation tool to position the partial-slot card guide within the full-sized slot;
   securing the partial-slot card guide within the full-sized slot to provide a partial-sized slot smaller than the full-sized slot;
   removing the partial-slot card guide installation tool from the full-sized slot; and
   aligning the partial-slot card guide installation tool within the full-sized slot by mating backplane alignment features of the partial-slot card guide installation tool with alignment features within the slot of the rack system.

* * * * *